United States Patent
Miyamoto et al.

(10) Patent No.: US 10,365,334 B2
(45) Date of Patent: Jul. 30, 2019

(54) STORAGE BATTERY CONTROL DEVICE, POWER STORAGE SYSTEM, CONTROL METHOD, AND COMPUTER-READABLE MEDIUM

(71) Applicant: NEC Corporation, Minato-ku, Tokyo (JP)

(72) Inventors: Junichi Miyamoto, Tokyo (JP); Hiroshi Kajitani, Tokyo (JP); Sho Ohtani, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/574,518

(22) PCT Filed: May 19, 2016

(86) PCT No.: PCT/JP2016/002438
§ 371 (c)(1),
(2) Date: Nov. 16, 2017

(87) PCT Pub. No.: WO2016/189832
PCT Pub. Date: Dec. 1, 2016

(65) Prior Publication Data
US 2018/0128880 A1     May 10, 2018

(30) Foreign Application Priority Data
May 25, 2015     (JP) .................. 2015-105112

(51) Int. Cl.
*H02J 7/00* (2006.01)
*G01R 31/3842* (2019.01)
(Continued)

(52) U.S. Cl.
CPC ......... *G01R 31/3842* (2019.01); *G01R 31/36* (2013.01); *H01M 10/42* (2013.01);
(Continued)

(58) Field of Classification Search
CPC .................................... G01R 31/3624
(Continued)

(56) References Cited

U.S. PATENT DOCUMENTS 7,633,265 B2 * 12/2009 Matsushima ............. H02J 7/00
320/133
8,384,353 B2 *  2/2013 Miyazaki ............ H01M 10/441
320/120
(Continued)

FOREIGN PATENT DOCUMENTS

| JP | 2008-261669 A | 10/2008 |
| JP | 2009-031220 A | 2/2009 |

(Continued)

OTHER PUBLICATIONS

International Search Report for PCT Application No. PCT/JP2016/002438, dated Aug. 2, 2016.
English translation of Written opinion for PCT Application No. PCT/JP2016/002438.

*Primary Examiner* — Yalkew Fantu

(57) ABSTRACT

A storage battery control device includes: a voltage measurement means for measuring terminal voltage of a storage battery; a current measurement means for measuring charge current and discharge current of the storage battery; a capacity calculation means for calculating a cumulative capacity of the storage battery by using the charge current measured by a current measurement unit; a control means for determining an operation of the storage battery, based on at least one of the terminal voltage, the charge current, the discharge current, and the cumulative capacity; and a charging/discharging control means for causing the storage battery to operate in accordance with an instruction from the control means, and the charging/discharging control means causes the storage battery to charge by a first charging method from a discharge end voltage to a first charge voltage, to charge by a second charging method at the first
(Continued)

charge voltage, to charge by the first charging method from the first charge voltage to a second charge voltage, and to charge by the second charging method at the second charge voltage.

8 Claims, 6 Drawing Sheets

(51) Int. Cl.
- *G01R 31/36* (2019.01)
- *H01M 10/42* (2006.01)
- *H01M 10/44* (2006.01)
- *H01M 10/48* (2006.01)

(52) U.S. Cl.
CPC ........... *H01M 10/44* (2013.01); *H01M 10/48* (2013.01); *H02J 7/00* (2013.01); *H02J 7/007* (2013.01); *H02J 7/0047* (2013.01); *H02J 7/0073* (2013.01); *H02J 2007/005* (2013.01)

(58) Field of Classification Search
USPC .......................................................... 320/134
See application file for complete search history.

(56) References Cited

U.S. PATENT DOCUMENTS

| | | | |
|---|---|---|---|
| 2008/0255783 A1* | 10/2008 | Tamai | G01R 31/361 702/63 |
| 2009/0033292 A1* | 2/2009 | Majima | G01R 31/3624 320/153 |
| 2013/0311118 A1* | 11/2013 | Sejima | G01R 31/362 702/63 |
| 2014/0177145 A1 | 6/2014 | Kawahara et al. | |
| 2014/0379188 A1* | 12/2014 | Uesaka | H01M 10/44 701/22 |
| 2015/0070024 A1* | 3/2015 | Kim | G01R 31/3679 324/430 |
| 2015/0372514 A1* | 12/2015 | Kobayashi | H01M 10/482 320/134 |

FOREIGN PATENT DOCUMENTS

| | | |
|---|---|---|
| JP | 2011-043460 A | 3/2011 |
| JP | 2011-108550 A | 6/2011 |
| JP | 2013-247045 A | 12/2013 |
| JP | 2014-119265 A | 6/2014 |

* cited by examiner

STORAGE BATTERY CONTROL DEVICE, POWER STORAGE SYSTEM, CONTROL METHOD, AND COMPUTER-READABLE MEDIUM

This application is a National Stage Entry of PCT/JP2016/002438 filed on May 19, 2016, which claims priority from Japanese Patent Application 2015-105112 filed on May 25, 2015, the contents of all of which are incorporated herein by reference, in their entirety.

TECHNICAL FIELD

The present invention relates to a storage battery control device, a power storage system, a control method, and a computer-readable medium.

BACKGROUND ART

A storage battery for domestic or industrial use has a problem that a storage capacity of the storage battery at a full charge is decreased by repeatedly charging and discharging. Accordingly, a technique for calculating an actual capacity of a storage battery has been proposed.

PTL 1 calculates an actual capacity, based on a charge capacity obtained from a completely discharged state to a fully charged state. At this time, it is determined that the completely discharged state is reached when discharge voltage becomes a predetermined value (e.g., about 3V).

CITATION LIST

Patent Literature

[PTL1] Japanese Unexamined Patent Application Publication No. 2013-247045

SUMMARY OF INVENTION

Technical Problem

However, in PTL 1, an actual capacity is calculated based on a charge capacity obtained from the completely discharged state to the fully charged state, assuming that the completely discharged state is reached when discharge voltage becomes a predetermined value, thus, there is the following problem.

Specifically, discharge current generated when a storage battery is discharged to the completely discharged state varies in accordance with a load connected to the storage battery. Accordingly, in PTL 1, when the discharge current is small, a discharge period until the completely discharged state is reached, becomes long. Further, since the storage battery is charged until the fully charged state is reached after the storage battery is discharged until the completely discharged state is reached, a charge period becomes long. Thus, there is a problem that time required for a series of actual capacity calculation processes of discharging and charging increases.

In general, an internal resistance of a storage battery, such as a lithium ion battery, varies greatly in accordance with an environmental temperature and a degree of deterioration. In other words, a voltage drop based on an internal resistance R and a discharge current value I of a storage battery varies in accordance with an environmental temperature and a degree of deterioration.

Accordingly, in the technique of PTL 1 in which it is determined to be in the completely discharged state when the discharge current is a fixed predetermined value, there is a possibility of determining as being in the completely discharged state even when the battery has a remaining capacity. Thus, a charge amount obtained from a state where it is determined as being in the completely discharged state to the fully charged state does not always indicate an accurate battery capacity.

Accordingly, an object of the present invention is to provide a storage battery control device, a power storage system, and a control method, which are capable of reducing time required for obtaining a full charge capacity and improving accuracy of the full charge capacity.

Solution to Problem

A storage battery control device according to the present invention includes:

a voltage measurement means for measuring terminal voltage of a storage battery;

a current measurement means for measuring charge current and discharge current of the storage battery;

a capacity calculation means for calculating a cumulative capacity of the storage battery by using the charge current measured by a current measurement unit;

a control means for determining an operation of the storage battery, based on at least one of the terminal voltage, the charge current, the discharge current, and the cumulative capacity; and a charging/discharging control means for causing the storage battery to operate in accordance with an instruction from the control means, wherein the charging/discharging control means causes the storage battery to charge by a first charging method from a discharge end voltage to a first charge voltage, to charge by a second charging method at the first charge voltage, to charge by the first charging method from the first charge voltage to a second charge voltage, and to charge by the second charging method at the second charge voltage.

A power storage system according to the present invention includes:

a storage battery including a plurality of secondary cells;

a voltage measurement means for measuring voltage of the storage battery;

a current measurement means for measuring charge current and discharge current of the storage battery;

a capacity calculation means for calculating a cumulative capacity of the storage battery by using the charge current measured by the current measurement means;

a control means for determining an operation of the storage battery, based on at least one of the terminal voltage, the charge current, the discharge current, and the cumulative capacity; and a charging/discharging control means for controlling power of the storage battery, based on an instruction from the control means, wherein the charging/discharging control means causes the storage battery to charge by a first charging method from a discharge end voltage to a first charge voltage, to charge by a second charging method at the first charge voltage, to charge by the first charging method from the first charge voltage to a second charge voltage, and to charge by the second charging method at the second charge voltage.

A control method according to the present invention is a control method for controlling charging and discharging of a storage battery, the control method including:

measuring terminal voltage of a storage battery;

measuring charge current and discharge current of the storage battery;

calculating a cumulative capacity of the storage battery by using the charge current;

determining an operation of the storage battery, based on at least one of the terminal voltage, the charge current, the discharge current, and the cumulative capacity; and controlling power of the storage battery, based on the determined operation of the storage battery, wherein the control of power of the storage battery includes:

causing the storage battery to charge by a first charging method from a discharge end voltage to a first charge voltage;

to charge by a second charging method at the first charge voltage;

to charge by the first charging method from the first charge voltage to a second charge voltage; and to charge by the second charging method at the second charge voltage.

A non-transitory computer-readable medium storing a control program according to the present invention causes a computer to perform:

measuring terminal voltage of a storage battery;

measuring charge current and discharge current of the storage battery;

calculating a cumulative capacity of the storage battery by using the charge current;

determining an operation of the storage battery, based on at least one of the terminal voltage, the charge current, the discharge current, and the cumulative capacity; and controlling power of the storage battery, based on the determined operation of the storage battery, wherein the control of power of the storage battery includes:

causing the storage battery to charge by a first charging method from a discharge end voltage to a first charge voltage;

to charge by a second charging method at the first charge voltage;

to charge by the first charging method from the first charge voltage to a second charge voltage; and to charge by the second charging method at the second charge voltage.

Advantageous Effects of Invention

It is possible to reduce time required for obtaining a full charge capacity and to improve accuracy of the full charge capacity.

DESCRIPTION OF EMBODIMENTS

Figure 1:
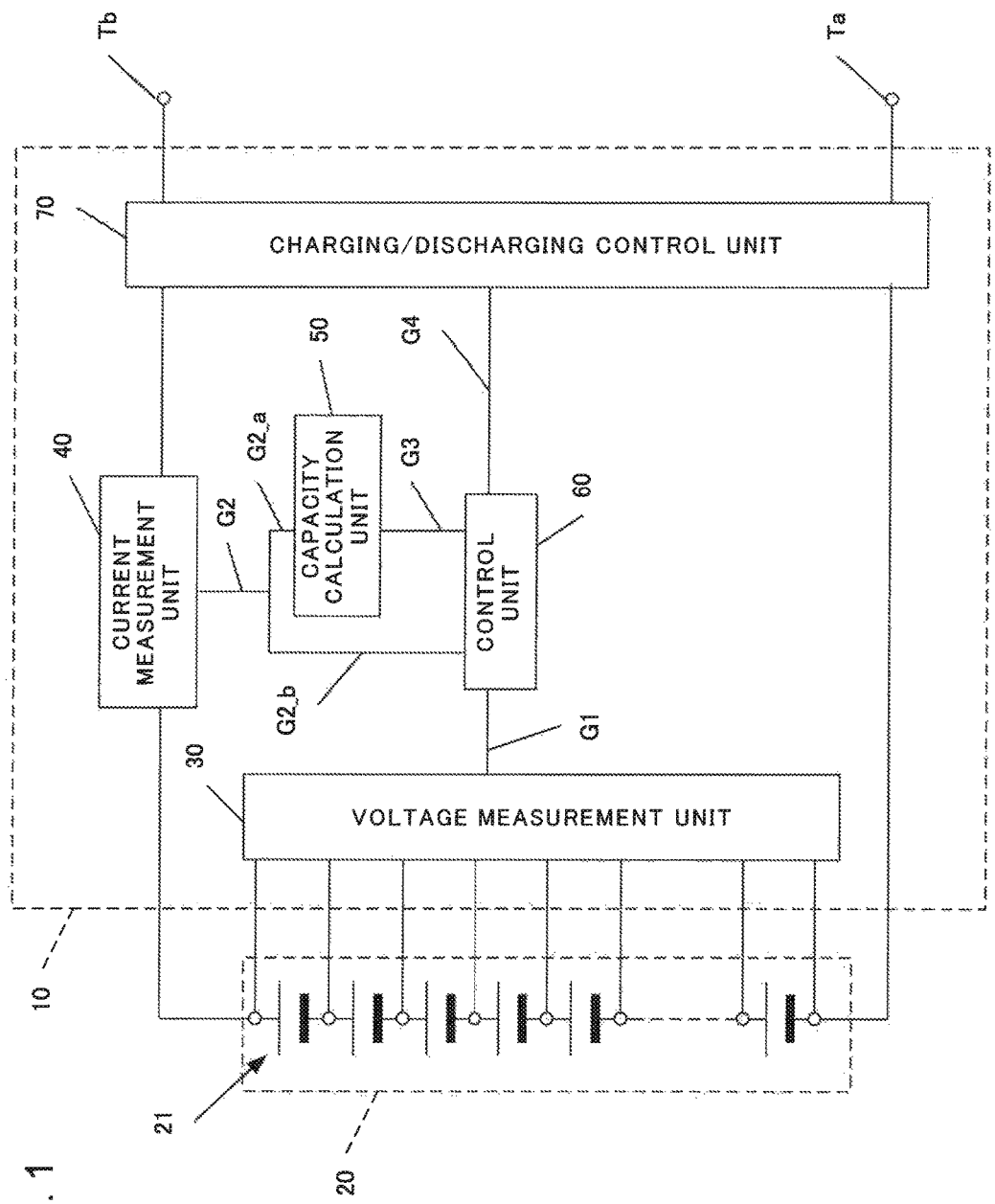
FIG. 1 is an example of a block diagram illustrating a storage battery control device according to this example embodiment.

Example embodiments of the present invention will be described. FIG. 1 is a diagram illustrating a configuration of a power storage system according to this example embodiment. The power storage system according to this example embodiment includes a storage battery control device 10 and a storage battery 20.

The storage battery control device 10 includes the storage battery 20, a voltage measurement unit 30, a current measurement unit 40, a capacity calculation unit 50, a control unit 60, and a charging/discharging control unit 70.

The storage battery 20 includes a plurality of secondary cells 21. The storage battery 20 may have a configuration in which the plurality of secondary cells 21 is connected in series or in parallel. Alternatively, the plurality of secondary cells 21 connected in series or in parallel may be further connected in series or in parallel. For example, a lithium ion secondary cell may be used as each secondary cell 21. The storage battery 20 can be charged from outside and discharged to the outside via a negative terminal Ta and a positive terminal Tb.

The voltage measurement unit 30 is connected to terminals of the respective secondary cells 21. The voltage measurement unit 30 measures terminal voltage of each secondary cell 21, and outputs terminal voltage information G1 to the control unit 60. The terminal voltage information G1 may indicate terminal voltage of the storage battery 20, or the terminal voltage of each secondary cell 21. Alternatively, the terminal voltage information G1 may indicate an average value of the terminal voltages of the respective secondary cells 21.

The voltage measurement unit 30 preferably transmits the terminal voltage information G1 to the control unit 60 in synchronization with the current measurement unit 40. In this case, however, the voltage measurement unit 30 may transmit the terminal voltage information G1 to the control unit 60 at a timing different from a timing when the current measurement unit 40 outputs information. For example, the control unit 60 may output an output request for the terminal voltage information G1 to the voltage measurement unit 30. In this case, the voltage measurement unit 30 may measure the terminal voltage and output the terminal voltage information G1 in response to the output request, or may output the already measured terminal voltage information G1. The same holds true for a timing of measuring charge current or discharge current of the current measurement unit 40, and an output timing of charge/discharge current information G2 of the current measurement unit 40.

The current measurement unit 40 measures the charge current and the discharge current of the storage battery 20 at a predetermined time interval, or at a designated time, and outputs the measurement result to the capacity calculation unit 50 and the control unit 60 as the charge/discharge current information G2.

Note that the charge/discharge current information G2 is output to the capacity calculation unit 50 and the control unit 60. When it is necessary to distinguish an output destination, the charge/discharge current information G2 to be output to the capacity calculation unit 50 is referred to as capacity calculation charge/discharge current information G2_a, and the charge/discharge current information G2 to be output to the control unit 60 is referred to as control charge/discharge current information G2_b.

The current measurement unit 40 may be composed by using a galvanometer, a galvanoscope using a shunt resistance, a clamp meter, or the like. However, the current measurement unit 40 may also be composed of a device other than these devices. The charge/discharge current information G2 may indicate a measured current value, or an average value of results obtained by performing measurements a plurality of times.

The capacity calculation unit 50 calculates a cumulative capacity of the storage battery 20. Further, the capacity calculation unit 50 outputs the calculated cumulative capacity to the control unit 60 as cumulative capacity information G3.

The capacity calculation unit 50 calculates the cumulative capacity based on the charge/discharge current information G2 received from the current measurement unit 40. Specifically, the capacity calculation unit 50 calculates the cumulative capacity by time-integrating the charge current or the discharge current indicated by the charge/discharge current information G2.

For example, the cumulative capacity is calculated by multiplying a current value at the current time by a difference time between the current time and calculation time prior to the current time. Specifically, the capacity calculation unit 50 calculates the cumulative capacity as an integral value for each period of the current value indicated by the charge/discharge current information G2. As a unit for an integral capacity, [Ah] is generally used. The capacity calculation unit 50 calculates the cumulative capacity by integrating the calculated capacities assuming that the current in a charging direction is positive and the current in a discharging direction is negative.

The control unit 60 calculates a full charge capacity of the storage battery 20 based on the terminal voltage information G1, the charge/discharge current information G2, and the cumulative capacity information G3. Further, the control unit 60 determines an operation of the storage battery 20 based on at least one of the terminal voltage information G1, the charge/discharge current information G2, and the cumulative capacity information G3. The control unit 60 outputs, to the charging/discharging control unit 70, a charging/discharging control command G4 indicating the determined operation. Note that the control unit 60 may receive a control signal from an external device, which is not illustrated, and output the charging/discharging control command G4 based on the control signal.

The charging/discharging control command G4 may be information for instructing an operation mode (charging mode, discharging mode, stand-by mode) of the storage battery 20. Alternatively, the charging/discharging control command G4 may be information indicating charging power or discharging power. More alternatively, the charging/discharging control command G4 may include both the information indicating the operation mode and the information indicating the charging power or discharging power.

The control unit 60 calculates a charging rate (SOC: State of Charge) based on the cumulative capacity information G3 calculated by the capacity calculation unit 50. The SOC can be defined by a capacity ratio [%] between the full charge capacity at the current time and the cumulative capacity from the completely discharged state. The SOC can be calculated by Formula 1.

$$SOC = \left( \frac{\text{cumulative capacity from completely discharged state to current state}}{\text{full charge capacity at current time}} \right) \times 100 \quad (1)$$

The control unit 60 may store the calculated SOC. The control unit 60 may also store a preliminarily assumed internal resistance of the storage battery 20. Alternatively, the control unit 60 may calculate the internal resistance of the storage battery 20 by using the calculated full charge capacity, and may store the calculated internal resistance.

The control unit 60 preliminarily stores an allowable voltage range and an allowable current range in which the secondary cells 21 can operate. The storage battery 20 generates power by chemical reaction. Accordingly, when each secondary cell 21 is a single lithium ion secondary cell, allowable voltage range of 2.5 V to 4.2 V can be illustrated.

When a value of the terminal voltage of each secondary cell 21 indicated by the terminal voltage information G1 is outside of the allowable voltage range, the control unit 60 outputs, to the charging/discharging control unit 70, the charging/discharging control command G4 for instructing the storage battery 20 to stop charging or discharging. Thus, it is possible to prevent overcharge or overdischarge by stopping charging or discharging when the voltage value of each secondary cell 21 is outside of the allowable voltage range.

When a value of the charge current or discharge current indicated by the charge/discharge current information G2 output by the current measurement unit 40 is outside of the allowable current range, the control unit 60 outputs, to the charging/discharging control unit 70, the charging/discharging control command G4 for instructing the storage battery 20 to stop charging or discharging. Charging or discharging is stopped when the charge current or discharge current of each secondary cell 21 is outside of the allowable current range, thereby making it possible to prevent overcurrent.

The charging/discharging control unit 70 has a power conversion function such as a bidirectional DC/DC converter or AC/DC converter. The charging/discharging control unit 70 controls the power of the storage battery 20 based on the charging/discharging control command G4 from the control unit 60. The control of power of the storage battery 20 includes stopping of discharging, stopping of charging, and adjustment of charging and discharging outputs.

Figure 2:
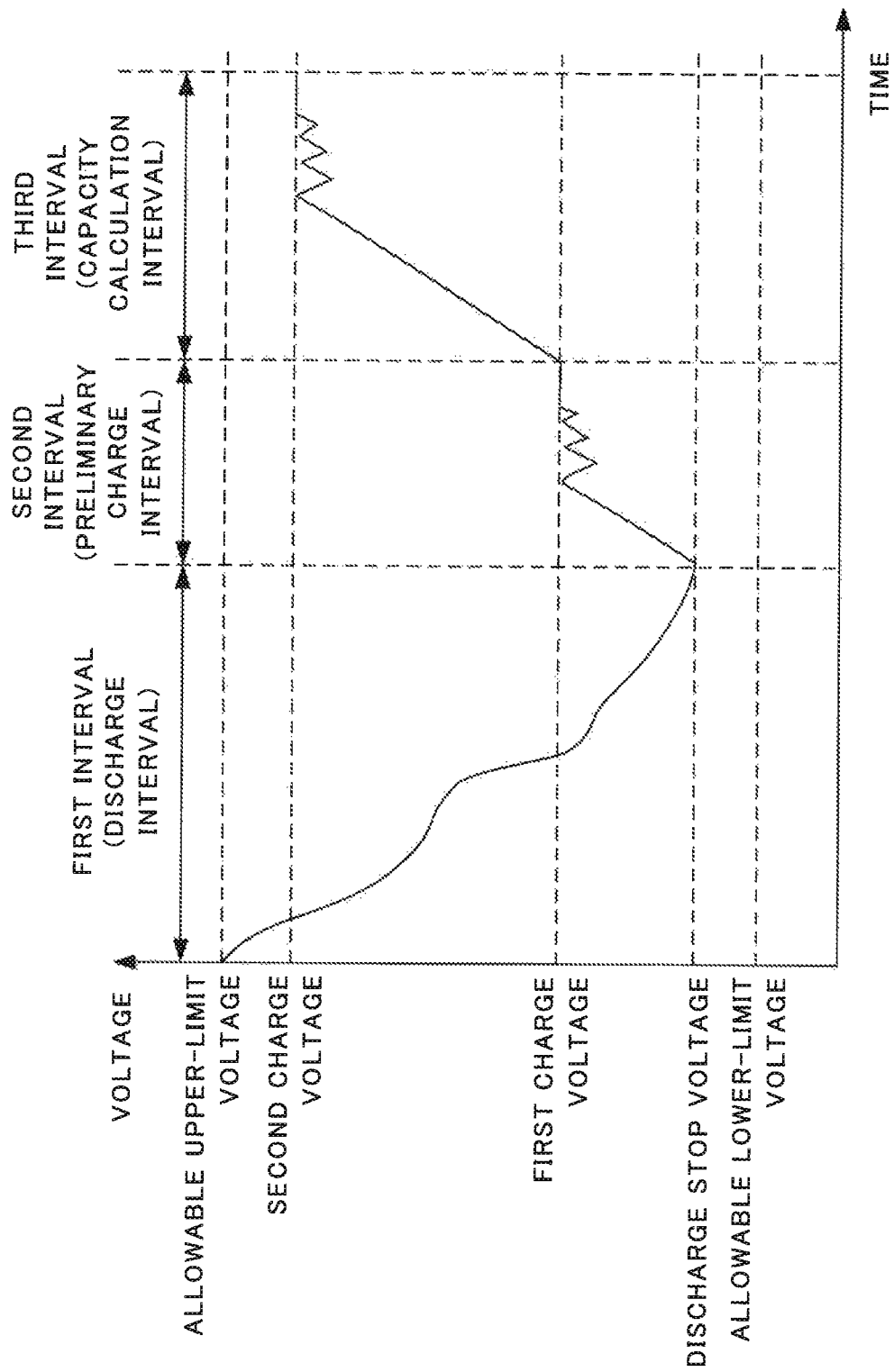
FIG. 2 is a diagram illustrating an example of a waveform of a voltage of a storage battery.
Figure 3:
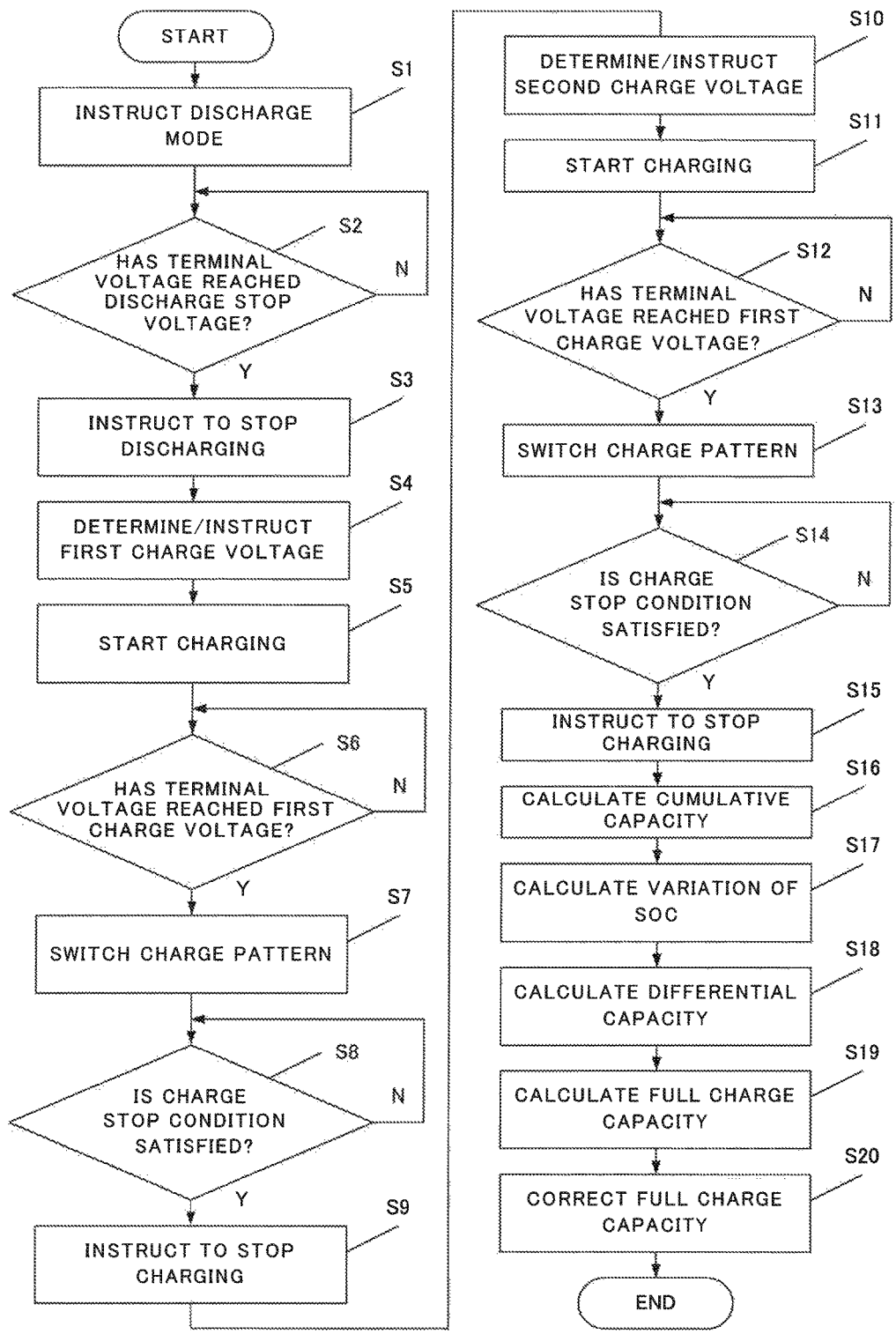
FIG. 3 is a flowchart illustrating an example of an operation of the storage battery control device according to this example embodiment.

Next, an operation of the storage battery control device 10 will be described with reference to FIGS. 2 and 3. FIG. 2 is a diagram illustrating an example of a waveform of a voltage of the storage battery 20. FIG. 3 is a flowchart illustrating a flow of an operation of the charging/discharging control device 10.

In FIG. 2, a first interval indicates a discharge interval during a normal operation; a second interval indicates a preliminary charge interval; and a third interval indicates a capacity calculation interval.

In step S1, the control unit 60 outputs, to the charging/discharging control unit 70, the charging/discharging control command G4 for instructing the storage battery 20 to operate in discharging mode. The charging/discharging control unit 70 causes the storage battery 20 to discharge according to the received charging/discharging control command G4.

In step S2, the control unit 60 determines, based on the terminal voltage information G1, whether or not the terminal voltage has reached the discharge stop voltage. The voltage measurement unit 30 measures the terminal voltage of each secondary cell 21. The voltage measurement unit 30 outputs the measured terminal voltage to the control unit 60 as the terminal voltage information G1. The control unit 60 determines whether or not the terminal voltage of each secondary cell 21 indicated by the received terminal voltage information G1 has reached the discharge stop voltage. When the terminal voltage has reached the discharge stop voltage, the process proceeds to step S3. When the terminal voltage has not reached the discharge stop voltage, step S2 is repeated.

The discharge stop voltage is an upper limit of a voltage at which the preliminary charge interval is started. Note that the discharge stop voltage need not necessarily match an allowable lower-limit voltage in the allowable voltage range, or the discharge end voltage. The discharge stop voltage may be voltage for simply stopping discharging. The discharge stop voltage is preferably an appropriately higher voltage, and is a voltage at which the storage battery can be charged from the discharge stop voltage to a first charge voltage which is described below.

A method for setting the discharge voltage is not limited. For example, the control unit 60 may set the discharge stop voltage based on the SOC calculated by the control unit 60. Further, a charging/discharging schedule may be set to the control unit 60, and an instruction for stopping discharging of the storage battery 20 may be sent according to the charging/discharging schedule.

In step S3, the control unit 60 outputs, to the charging/discharging control unit 70, the charging/discharging control command G4 for instructing to stop discharging. The charging/discharging control unit 70 stops discharging of the storage battery 20 according to the received charging/discharging control command G4. When discharging is stopped, the discharge interval, which is the first interval, ends. Specifically, the first interval is an interval from the start of discharging to a time when the terminal voltage reaches the discharge stop voltage.

In step S4, the control unit 60 determines the first charge voltage for stopping charging in the second interval. The control unit 60 outputs, to the charging/discharging control unit 70, the charging/discharging control command G4 for instructing the storage battery 20 to charge until the determined first charge voltage is reached.

The first charge voltage can be calculated based on the voltage obtained when discharging of the storage battery 20 is stopped, the discharge current value (absolute value) obtained immediately before discharging is stopped, and the internal resistance of the storage battery 20. Specifically, the first charge voltage is set to a value that satisfies Formula (2).

first charge voltage≥{discharge stop voltage+(internal resistance of storage battery×discharge current value)} (2)

Note that the calculation of the first charge voltage does not need to be limited to Formula 2, as long as the first charge voltage is higher than the discharge stop voltage.

In step S5, the charging/discharging control unit 70 causes the storage battery 20 to charge by a first charging method until the first charge voltage is reached. The charging/discharging control unit 70 sets the storage battery 20 to the charging mode according to the charging/discharging control command G4, and causes the storage battery to charge until the first charge voltage is reached.

The first charging method may be a constant current (CC) charging. Alternatively, the first charging method may be constant power (CP) charging or pulse charging. A method in which CC charging is performed at a variable rate may be employed.

In step S6, the control unit 60 determines whether the terminal voltage of each secondary cell 21 has reached the first charge voltage. The voltage measurement unit 30 measures the terminal voltage of each secondary cell 21. Further, the voltage measurement unit 30 outputs the measured terminal voltage to the control unit 60 as the terminal voltage information G1. The control unit 60 determines whether the terminal voltage of each secondary cell 21 indicated by the received terminal voltage information G1 has reached the first charge voltage. When the terminal voltage has reached the discharge stop voltage, the process proceeds to step S7. When the terminal voltage has not reached the first charge voltage, step S6 is repeated until the terminal voltage reaches the first charge voltage.

In step S7, the charging/discharging control unit 70 switches the method for charging the storage battery 20 from the first charging method to the second charging method. The reason for switching the method to the second charging method is that the terminal voltage at the end of charging is more accurately set to the target voltage, i.e., the first charge voltage. The second charging method may be, for example, constant voltage (CV) charging.

In step S8, the control unit 60 determines whether the storage battery 20 satisfies a charge stop condition. When the storage battery 20 satisfies the charge stop condition, the process proceeds to step S9. When the storage battery 20 does not satisfy the charge stop condition, the control unit 60 repeats step S8.

The charge stop condition may be a condition indicating that the charge current measured by the current measurement unit 40 satisfies a predetermined condition. Alternatively, the charge stop condition may be a condition indicating that the charge current measured by the current measurement unit 40 and the charge period satisfy a predetermined condition.

For example, the control unit 60 instructs the storage battery 20 to stop charging when the storage battery 20 satisfies any one of the following first to fourth charge stop conditions.

(1) First charge stop condition: The charge current of the storage battery 20 is sufficiently small
(2) Second charge stop condition: A predetermined time has passed after the method is switched to the second charging method
(3) Third charge stop condition: Both the first charge stop condition and the second charge stop condition are satisfied
(4) Fourth charge stop condition: A predetermined time has passed after the charge current becomes sufficiently small Note that the charge stop conditions are not limited to the above conditions, and other conditions may be used.

In step S9, the control unit 60 outputs, to the charging/discharging control unit 70, the charging/discharging control command G4 for instructing the storage battery 20 to stop charging. The charging/discharging control unit 70 causes the storage battery 20 to stop charging by the second charging method according to the charging/discharging control command G4. In this case, the preliminary charge interval, which is the second interval, ends. Specifically, the second interval is an interval from the end of the first interval to a time when charging by using the second charging method until the first charge voltage is reached ends.

In step S10, the control unit 60 determines the second charge voltage indicating a voltage for terminating charging in the third interval. Note that the control unit 60 may determine the second charge voltage in advance. For example, the second charge voltage may be determined before step S9 is completed. The second charge voltage may be calculated based on the charge current and the internal resistance of the storage battery 20. For example, the second charge voltage may be calculated by Formula (3) by using charge current of the constant current in CCCV charging and the internal resistance of the storage battery 20. The second charge voltage is a voltage with which the storage battery 20 can be charged from at least the first charge voltage by the first charging method. In other words, the second charge voltage is a voltage higher than the first charge voltage.

$$\text{second charge voltage} \geq \{\text{first charge voltage} + (\text{internal resistance of storage battery} \times \text{charge current value})\} \quad (3)$$

The internal resistance of the storage battery 20 tends to increase with the operation of the storage battery. Accordingly, it is preferable that the control unit 60 preliminarily hold a maximum internal resistance value that can be taken by the storage battery 20.

Note that the first charge voltage can be preliminarily defined as a terminal voltage corresponding to an SOC of 70%, and the second charge voltage can be preliminarily defined as a terminal voltage corresponding to an SOC of 100%.

In step S11, the control unit 60 outputs, to the charging/discharging control command unit 70, the charging/discharging control command G4 for instructing the storage battery 20 to charge by the first charging method until the second charge voltage is reached. The charging/discharging control unit 70 causes the storage battery 20 to charge by the first charging method until the second charge voltage is reached.

In step S12, the control unit 60 determines whether or not the terminal voltage of each secondary cell 21 has reached the second charge voltage. When it is determined that the terminal voltage of each secondary cell 21 has reached the second charge voltage, the process proceeds to step S13. On the other hand, when the terminal voltage of each secondary cell 21 has not reached the second charge voltage, step S12 is repeated.

In step S13, the charging/discharging control unit 70 switches the method for charging the storage battery 20 from the first charging method to the second charging method.

In step S14, it is determined whether or not the charge stop condition is satisfied. The charge stop condition used in step S8 can be used as the charge stop condition. Alternatively, a charge stop condition different from that used in step S8 may be used. When the control unit 60 determines that the charge stop condition is satisfied, the process proceeds to step S15. On the other hand, when it is determined that the charge stop condition is not satisfied, step S14 is repeated.

In step S15, the control unit 60 transmits, to the charging/discharging control unit 70, the charging/discharging control signal G4 for instructing the storage battery 20 to stop charging. The charging/discharging control unit 70 causes the storage battery 60 to stop charging according to the instruction indicated by the charging/discharging control signal G4.

In step S16, the capacity calculation unit 50 calculates a cumulative capacity Q1 at a time when the storage battery is charged from the discharge stop voltage to the first charge voltage, and a cumulative capacity Q2 at a time when the storage battery is charged to the second charge voltage. The cumulative capacity Q1 is a cumulative capacity obtained when the storage battery is charged from the discharge stop voltage to the first charge voltage by the first charging method. The cumulative capacity Q2 is a cumulative capacity obtained when the storage battery is charged by the first charging method until the second charge voltage is reached. The capacity calculation unit 50 transmits, to the control unit 60, the calculated cumulative capacities Q1 and Q2 as the cumulative capacity information G3.

In step S17, the control unit 60 calculates a variation $\Delta$SOC12 of the SOC between the first charge voltage and the second charge voltage.

Figure 4:
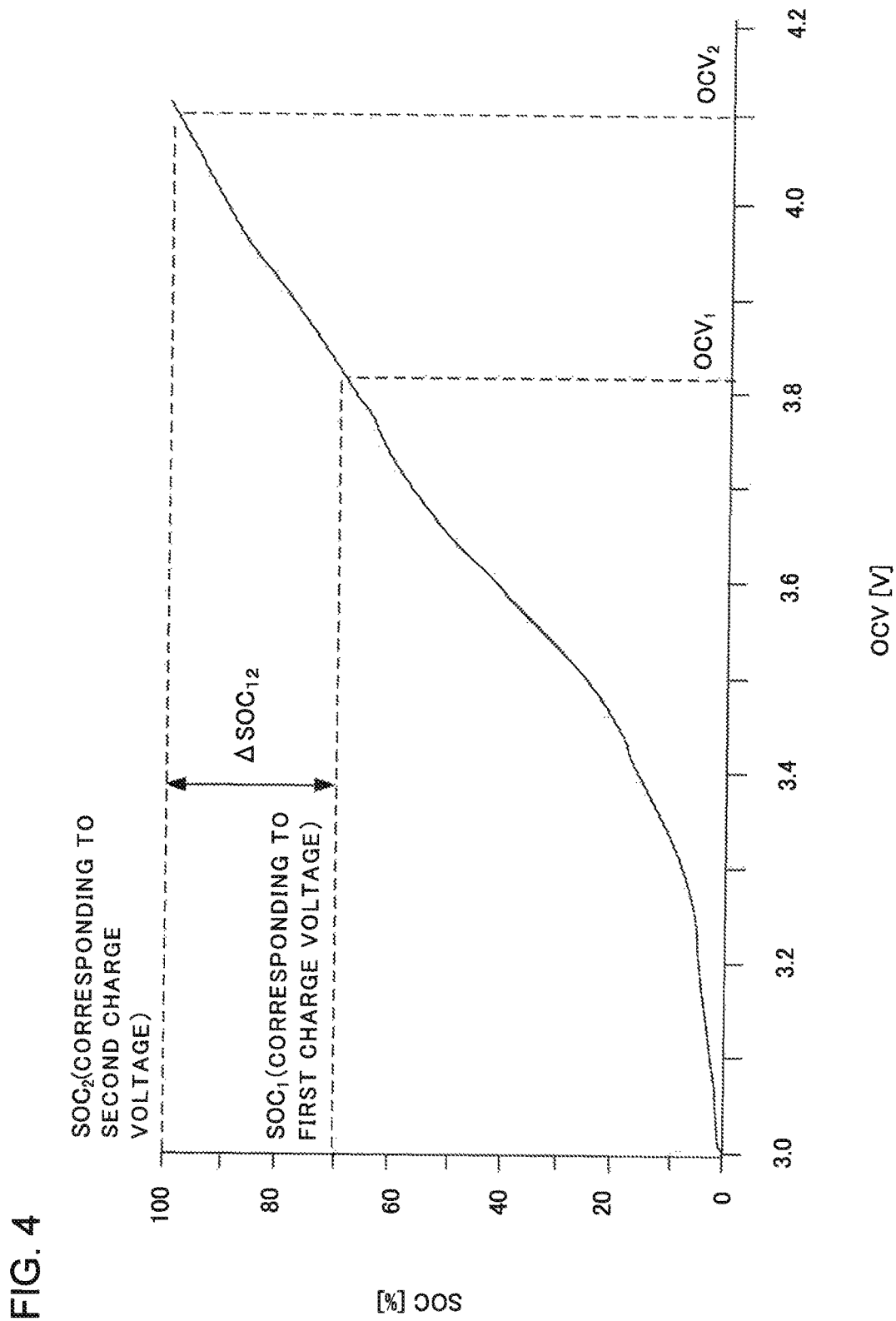
FIG. 4 is a diagram illustrating a relationship between an open circuit voltage and a remaining capacity of a secondary cell.

There is a relationship, for example, as illustrated in FIG. 4, between an open circuit voltage (OCV) in a no-load state of each secondary cell 21 and the SOC. Accordingly, in step S17, the control unit 60 calculates an SOC (hereinafter referred to as SOC1) corresponding to a first charge voltage OCV1, and an SOC (hereinafter referred to as SOC2) corresponding to a second charge voltage OCV2. The variation $\Delta$SOC12 of the SOC between the first charge voltage and the second charge voltage is calculated by using Formula (4).

$$\Delta SOC12 = SOC2 - SOC1 \quad (4)$$

In step S18, the control unit 60 calculates a differential capacity $\Delta$Q12 between the first charge voltage and the second charge voltage. The control unit 60 calculates the differential capacity $\Delta$Q12 by using the cumulative capacity Q1 of the first charge voltage indicated by the cumulative capacity information G3 and the cumulative capacity Q2 obtained until the second charge voltage is reached. The differential capacity $\Delta$Q12 between the first charge voltage and the second charge voltage is given by the following formula (5).

$$\Delta Q12 = Q2 - Q1 \quad (5)$$

In step S19, a full charge capacity Qfull [Ah] is calculated by using the differential capacity $\Delta$Q12 calculated in step S18. The full charge capacity Qfull can be calculated by using Formula (6).

$$Qfull = \left(\frac{\Delta Q12}{\Delta SOC12}\right) \times 100 \quad (6)$$

In step S20, the control unit 60 calculates a corrected full charge capacity Qfull_m. The control unit 60 calculates a full charge capacity Qfull_m by correcting the full charge capacity Qfull calculated in step S18, according to the SOC obtained before charging is started. When the corrected full charge capacity is calculated, the operation of the storage battery control device 10 is terminated.

Figure 5:
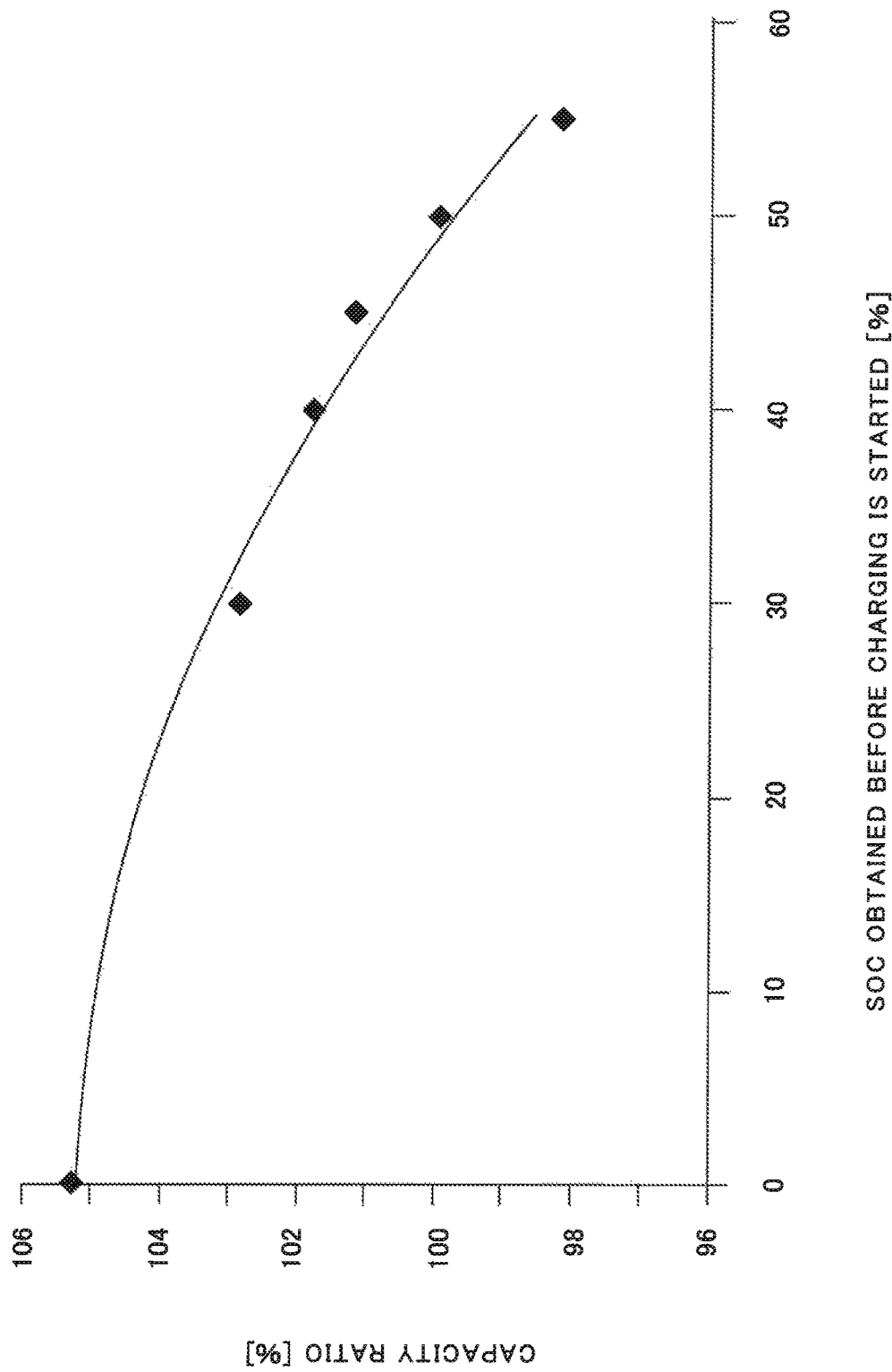
FIG. 5 is a diagram illustrating an example of a relationship between a capacity ratio of a calculated full charge capacity Qfull to a measured full charge capacity and an SOC obtained before charging is started.

FIG. 5 is a diagram illustrating an example of a relationship between a capacity ratio of the calculated full charge capacity Qfull to the measured full charge capacity and the SOC obtained before charging is started. In FIG. 5, the capacity ratio (capacity ratio=calculated full charge capacity Qfull/measured full charge capacity*100) of the full charge capacity Qfull calculated by Formula 6 to the measured full charge capacity, is given with respect to the SOC (SOC obtained before charging is started) which is obtained after discharging is completed and before charging by using the first charging method is started. As seen from FIG. 5, the capacity ratio increases as the SOC that is obtained before charging is started decreases. This indicates that a calculation error in the calculated full charge capacity Qfull with respect to the measured full charge capacity, increases as the SOC obtained before charging is started decreases.

Figure 6:
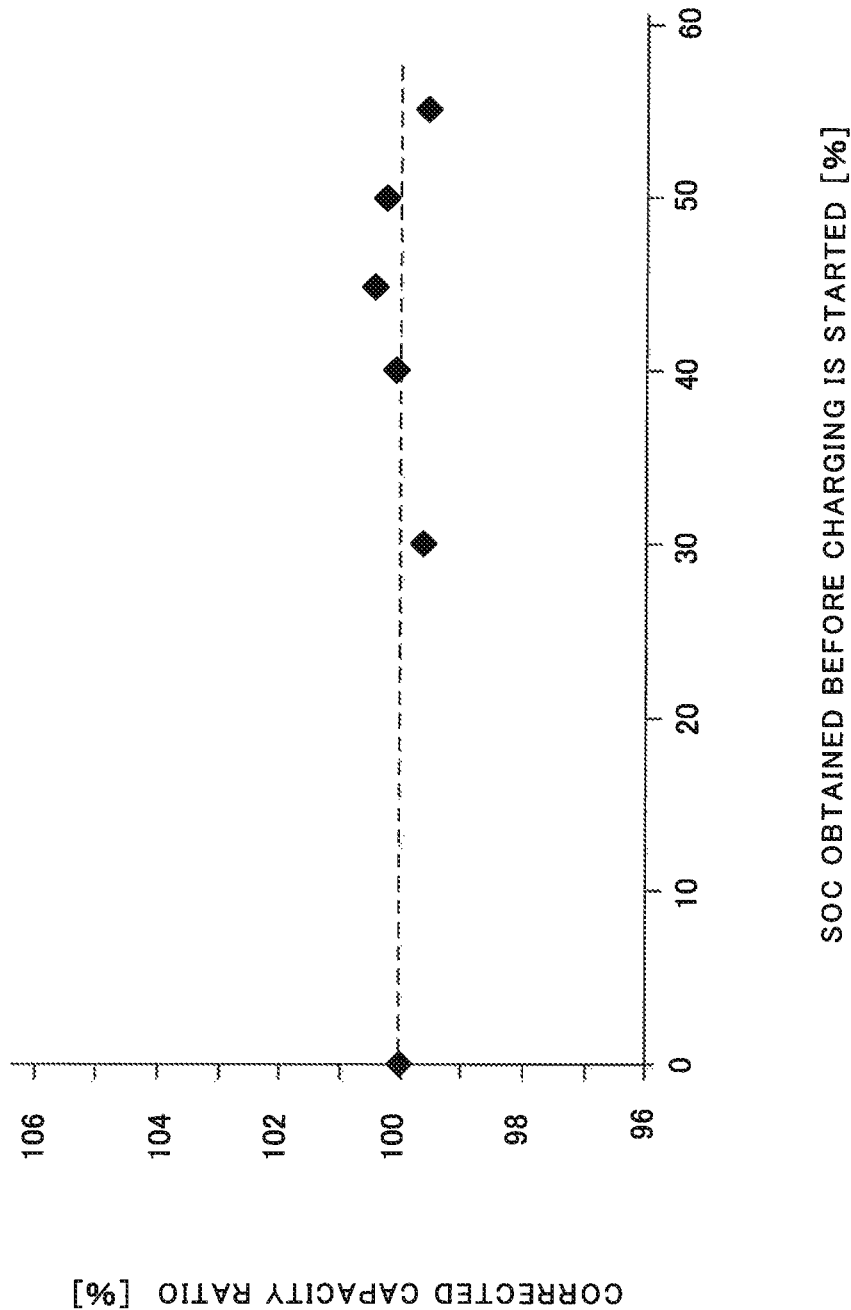
FIG. 6 is a diagram illustrating an example of a corrected capacity ratio with respect to the SOC obtained before charging is started.

FIG. 6 is a diagram illustrating an example of a corrected capacity ratio with respect to the SOC obtained before charging is started. In the example illustrated in FIG. 6, the corrected capacity ratio (corrected capacity ratio=calculated full charge capacity Qfull_m/actual full charge capacity*100) of the full charge capacity Qfull_m calculated by multiplying a correction coefficient (described below) by the calculated full charge capacity Qfull, to the actual full charge capacity, is given with respect to the SOC obtained before charging is started.

The correction coefficient is determined by the following procedure. First, the first charge voltage and the second charge voltage are determined by using a brand-new storage battery whose full charge capacity is obvious in advance, or a storage battery whose full charge capacity is measured.

Further, a charge amount obtained until the first charge voltage or the second charge voltage is reached is measured while changing the SOC before the storage battery is charged by the first charging method after discharging is stopped. The differential capacity $\Delta Q12$ is calculated based on the measurement result. The full charge capacity Qfull is calculated by Formula 6, by using the calculated differential capacity $\Delta Q12$. The capacity ratio between the calculated full charge capacity Qfull and the measured full charge capacity is calculated to thereby obtain the relationship as illustrated in FIG. 5.

After that, the correction coefficient is obtained according to the SOC obtained before charging is started so that the capacity ratio becomes 100% from FIG. 5.

Note that the control unit 60 associates the obtained correction coefficient with the SOC obtained before charging is started, and holds them in a look-up table, a formula, or the like.

As described above, the full charge capacity Qfull calculated by Formula 6 is corrected, to thereby improve the accuracy of the full charge capacity. Further, since the full charge capacity can be obtained without discharging the storage battery to the completely discharged state, the time required for discharging the storage battery to the completely discharged state can be omitted, which leads to an improvement in working efficiency.

The control unit 60 may hold the relationship between a deterioration rate of the full charge capacity and the internal resistance. For example, the initial full charge capacity, the full charge capacity according to a cycle obtained by conducting a charging/discharging cycle test, and the internal resistance may be preliminarily obtained before shipment, and the relationship between the deterioration rate of the full charge capacity and the internal resistance may be obtained.

The control unit 60 may store the initial full charge capacity of the storage battery control device 10, and may calculate a deterioration rate every time the full charge capacity is calculated. The control unit 60 may calculate a current internal resistance based on the stored relationship between the deterioration rate of the full charge capacity and the internal resistance.

A storage battery for domestic use may be operated in such a manner that the storage battery is discharged during day and night, and is fully charged at midnight when electricity rates are low. By setting the first charge voltage and the second charge voltage, the full charge capacity can be accurately calculated during charging at midnight, regardless of the SOC when discharging is stopped.

There are some storage batteries for domestic use which can set in such a manner that a remaining capacity is kept for backup. For example, an SOC of 0%, an SOC of 10%, an SOC of 20%, or an SOC of 30% may be set to be kept. In this case, a voltage corresponding to a capacity higher than the capacity that can be set may be set as the first charge voltage. For example, a voltage corresponding to an SOC of 50% may be set as the first charge voltage, and a voltage corresponding to an SOC of 100% may be set as the second charge voltage. Since the storage battery is discharged during day and night and discharging is stopped when a set value is reached, the storage battery can be charged from the first charge voltage, which is set during charging at midnight, to the second charge voltage in any setting. Accordingly, the differential capacity is measured during charging at midnight and is corrected according to the SOC when discharging is stopped, thereby making it possible to accurately calculate the full charge capacity.

The present invention is not limited to the example embodiments described above, and the configuration and details of the present invention can be modified in various ways that can be understood by those skilled in the art within the scope of the present invention.

This application is based upon and claims the benefit of priority from Japanese patent application No. 2015-105112, filed on May 25, 2015, the disclosure of which is incorporated herein in its entirety by reference.

REFERENCE SIGNS LIST

10 Storage battery control device
20 Storage battery
21 Secondary cell
30 Voltage measurement unit
40 Current measurement unit
50 Capacity calculation unit
60 Control unit
70 Charging/discharging control unit
G1 Terminal voltage information
G2 Charge/discharge current information
G3 Cumulative capacity information
G4 Charging/discharging control command

The invention claimed is:

1. A storage battery control device comprising:
a voltage measurement unit which measures terminal voltage of a storage battery;
a current measurement unit which measures charge current and discharge current of the storage battery;
a capacity calculation unit which calculates a cumulative capacity of the storage battery by using the charge current measured by the current measurement unit;
a control unit which determines an operation of the storage battery, based on at least one of the terminal voltage, the charge current, the discharge current, and the cumulative capacity; and
a charging/discharging control unit which causes the storage battery to operate in accordance with an instruction from the control unit, wherein
the charging/discharging control unit causes the storage battery
to charge by a first charging method from a discharge end voltage to a first charge voltage,
to charge by a second charging method at the first charge voltage, to charge by the first charging method from the first charge voltage to a second charge voltage, and to charge by the second charging method at the second charge voltage, wherein the control unit calculates a full charge capacity of the storage battery by using the cumulative capacity measured by the capacity measurement unit, the control unit calculates a differential capacity between a cumulative capacity obtained until the first charge voltage is reached, and a cumulative capacity obtained until the second charge voltage is reached, and the control unit calculates the full charge capacity, based on the differential capacity and a variation of a charging rate from the first charge voltage to the second charge voltage.

2. The storage battery control device according to claim 1, wherein the charging/discharging control unit determines to switch from the second charging method to the first charging method, based on the charge current of the storage battery.

3. The storage battery control device according to claim 1, wherein the control unit determines to switch from the second charging method to the first charging method, based on a period in which charging is performed by the second charging method.

4. The storage battery control device according to claim 1, wherein the first charge voltage is a voltage corresponding to a capacity higher than a discharge lower-limit capacity set by a user of the storage battery.

5. The storage battery control device according to claim 1, wherein the control unit corrects the full charge capacity in accordance with a charging rate of a storage battery at the discharge end voltage.

6. The storage battery control device according to claim 1, wherein the capacity measurement unit calculates a cumulative capacity obtained until the first charge voltage is reached and a cumulative capacity obtained until the second charge voltage is reached.

7. A power storage system comprising:

a storage battery including a plurality of secondary cells;

a voltage measurement unit which measures voltage of the storage battery;

a current measurement unit which measures charge current and discharge current of the storage battery;

a capacity calculation unit which calculates a cumulative capacity of the storage battery by using the charge current measured by the current measurement unit;

a control unit which determines an operation of the storage battery, based on at least one of the terminal voltage, the charge current, the discharge current, and the cumulative capacity; and a charging/discharging control unit which controls power of the storage battery, based on an instruction from the control unit, wherein the charging/discharging control unit causes the storage battery to charge by a first charging method from a discharge end voltage to a first charge voltage, to charge by a second charging method at the first charge voltage, to charge by the first charging method from the first charge voltage to a second charge voltage, and to charge by the second charging method at the second charge voltage, wherein the control unit calculates a full charge capacity of the storage battery by using the cumulative capacity measured by the capacity measurement unit, the control unit calculates a differential capacity between a cumulative capacity obtained until the first charge voltage is reached, and a cumulative capacity obtained until the second charge voltage is reached, and the control unit calculates the full charge capacity, based on the differential capacity and a variation of a charging rate from the first charge voltage to the second charge voltage.

8. A control method for controlling charging and discharging of a storage battery, comprising:

measuring terminal voltage of the storage battery;

measuring charge current and discharge current of the storage battery;

calculating a cumulative capacity of the storage battery by using the charge current;

determining an operation of the storage battery, based on at least one of the terminal voltage, the charge current, the discharge current, and the cumulative capacity; and controlling power of the storage battery, based on the determined operation of the storage battery, wherein the control of power of the storage battery includes:

causing to charge by a first charging method from a discharge end voltage to a first charge voltage;

to charge by a second charging method at the first charge voltage;

to charge by the first charging method from the first charge voltage to a second charge voltage; and to charge by the second charging method at the second charge voltage, wherein determining an operation of the storage battery comprises:

calculating a full charge capacity of the storage battery by using the cumulative capacity that has been measured, calculating a differential capacity between a cumulative capacity obtained until the first charge voltage is reached, and a cumulative capacity obtained until the second charge voltage is reached, and calculating the full charge capacity, based on the differential capacity and a variation of a charging rate from the first charge voltage to the second charge voltage.

* * * * *